United States Patent
Wakamatsu et al.

(10) Patent No.: US 7,403,045 B2
(45) Date of Patent: Jul. 22, 2008

(54) COMPARATOR CIRCUIT WITH REDUCED SWITCHING NOISE

(75) Inventors: Takeshi Wakamatsu, Saitama (JP); Naoaki Sugimura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 90 days.

(21) Appl. No.: 11/340,555

(22) Filed: Jan. 27, 2006

(65) Prior Publication Data

US 2006/0176085 A1    Aug. 10, 2006

(30) Foreign Application Priority Data

Feb. 10, 2005   (JP) ............................. 2005-034430

(51) Int. Cl.
*H03K 5/22* (2006.01)
*H03F 3/45* (2006.01)

(52) U.S. Cl. .............................. 327/65; 327/53; 327/66; 327/563

(58) Field of Classification Search ................. 327/63, 327/560–563, 52, 53, 58, 60, 62, 65–68, 327/72, 77–81, 88, 89

See application file for complete search history.

(56) References Cited

U.S. PATENT DOCUMENTS

| | | | | |
|---|---|---|---|---|
| 4,717,838 A | * | 1/1988 | Brehmer et al. | 327/66 |
| 5,032,744 A | * | 7/1991 | Wai Yeung Liu | 327/55 |
| 6,215,331 B1 | * | 4/2001 | Setty et al. | 327/51 |
| 7,183,812 B2 | * | 2/2007 | Nairn | 327/63 |

FOREIGN PATENT DOCUMENTS

| | | |
|---|---|---|
| JP | 5-67950 | 3/1993 |
| WO | WO 2004/047292 A1 * | 6/2004 |

OTHER PUBLICATIONS

Sedra and Smith. "Microelectronic Circuits". 2004. Oxford University Press. Fifth Edition. p. 728.*
Sedra and Smith. Microelectronic Circuits. 2004. Oxford University Press. Fifth Edition. p. 728.*

* cited by examiner

*Primary Examiner*—Quan Tra
*Assistant Examiner*—Colleen O'Toole
(74) *Attorney, Agent, or Firm*—Studebaker & Brackett PC; Donald R. Studebaker

(57) ABSTRACT

A comparator circuit includes a differential amplifier circuit, a latch circuit, and a control signal generating circuit. The latch circuit includes a pair of cross-coupled inverting amplifiers that pull the output signals of the differential amplifier to the high and low logic levels, a control transistor that activates the latch circuit in synchronization with a clock signal, and an equalizing transistor that equalizes the output signals when the latch circuit is inactive. The equalizing transistor is switched on and off by a control signal generated from the clock signal by the control signal generating circuit. The high-level potential of the control signal is lower than the high-level potential of the clock signal. Switching noise at the control electrode of the equalizing transistor is therefore reduced, permitting high-speed operation.

2 Claims, 2 Drawing Sheets

Prior Art

US 7,403,045 B2

COMPARATOR CIRCUIT WITH REDUCED SWITCHING NOISE

BACKGROUND OF THE INVENTION

1. Field of the Invention

The present invention relates to a high-speed, high-precision comparator circuit that can compare two weak signals and output a digital comparison result value in, for example, a high-speed analog-to-digital converter.

2. Description of the Related Art

Known comparators used in analog-to-digital converters include a differential amplifier circuit and a latch circuit that outputs a digital value synchronized to a clock signal. One example is shown in FIG. 1. The differential amplifier circuit has n-channel metal-oxide-semiconductor (NMOS) transistors M1, M2 coupled to a current mirror load circuit comprising p-channel metal-oxide-semiconductor (PMOS) transistors M3, M4, M5, M6. The latch circuit comprises NMOS transistors M7, M8, M9 and PMOS transistors M10, M11, M12.

In the differential amplifier circuit, the sources of transistors M1, M2 are connected to a current source I1, their gates receive input signals INP, INN, and their drains are connected to the drains and gates of transistors M3, M4 and the gates of transistors M5, M6. The sources of transistors M3, M4, M5, M6 receive a power supply voltage VDD; the drains of transistors M5, M6 are connected to the output terminals OUTP, OUTN of the comparator.

In the latch circuit, transistors M7, M11 constitute an inverting amplifier, which is cross-coupled to another inverting amplifier comprising transistors M8, M12, and is coupled to the input and output terminals OUTP, OUTN. Transistors M9 and M10 synchronize the operation of the inverting amplifiers with a clock signal (CLK) which they receive at their gates. Transistor M9 is inserted between the output terminals OUTP, OUTN; transistor M10 is inserted between the sources of transistors M11, M12 and the power supply. The sources of transistors M7, M8 are connected to ground.

This conventional comparator circuit operates as follows.

When the clock signal CLK is high, transistor M9 conducts, equalizing the output terminals OUTP, OUTN to the same potential, while transistor M10 is taken out of conduction, inactivating the latch circuit. Any potential difference between the input signals INP and INN is amplified by transistors M1-M4, but as the output terminals OUTP, OUTN are equalized, amplification is confined to the differential amplifier circuit.

Next, when the clock signal CLK goes low, transistor M9 is taken out of conduction and transistor M10 conducts, activating the inverting amplifiers in the latch circuit. Current mirror transistors M5, M6 transfer the amplified potential difference from the differential amplifier circuit to the output terminals OUTP and OUTN. The cross-coupled inverting amplifiers formed by transistors M7, M8, M11, M12 amplify the potential difference further so that the potentials at the output terminals OUTP, OUTN diverge to the power supply level and the ground level. The latch circuit then holds the output terminals OUTP, OUTN at these levels.

One example of this type of comparator is disclosed in Japanese Patent Application Publication No. 5-67950.

A problem that occurs in this type of comparator is that the output levels are affected by switching noise. More specifically, the high-to-low transition of the clock signal that activates the latch circuit is capacitively coupled through transistor M9 to the input and output terminals OUTP, OUTN. As shown in FIG. 2, accordingly, at the fall of the clock signal (CLK), the output potentials (OUTP, OUTN) dip temporarily toward the ground level before they begin to diverge. The divergence of the output potentials to the power-supply and ground levels (equal to the high and low logic levels of the clock signal) is accordingly delayed, slowing the response of the comparator circuit.

SUMMARY OF THE INVENTION

An object of the present invention is to reduce the effect of switching noise on the response speed of a comparator circuit.

A comparator circuit according to the present invention includes a differential amplifier circuit, a latch circuit, and a control signal generating circuit. The differential amplifier circuit includes a differential transistor pair and a current mirror load circuit, which cooperate to produce a pair of output signals from a pair of input signals. The latch circuit includes a pair of cross-coupled inverting amplifiers that pull the output signals to the high and low logic levels, a control transistor that activates the latch circuit in synchronization with a clock signal, and an equalizing transistor that equalizes the pair of output signals when the latch circuit is inactive.

The control signal generating circuit generates a control signal from the clock signal, and outputs the control signal to the control electrode of the equalizing transistor. The control signal has a high logic level lower than the high level of the clock signal. Switching noise at the control electrode of the equalizing transistor when the control signal falls from its high level to its low level is therefore reduced, and the effect of switching noise on the response speed of the comparator is reduced accordingly.

DETAILED DESCRIPTION OF THE INVENTION

Figure 1:
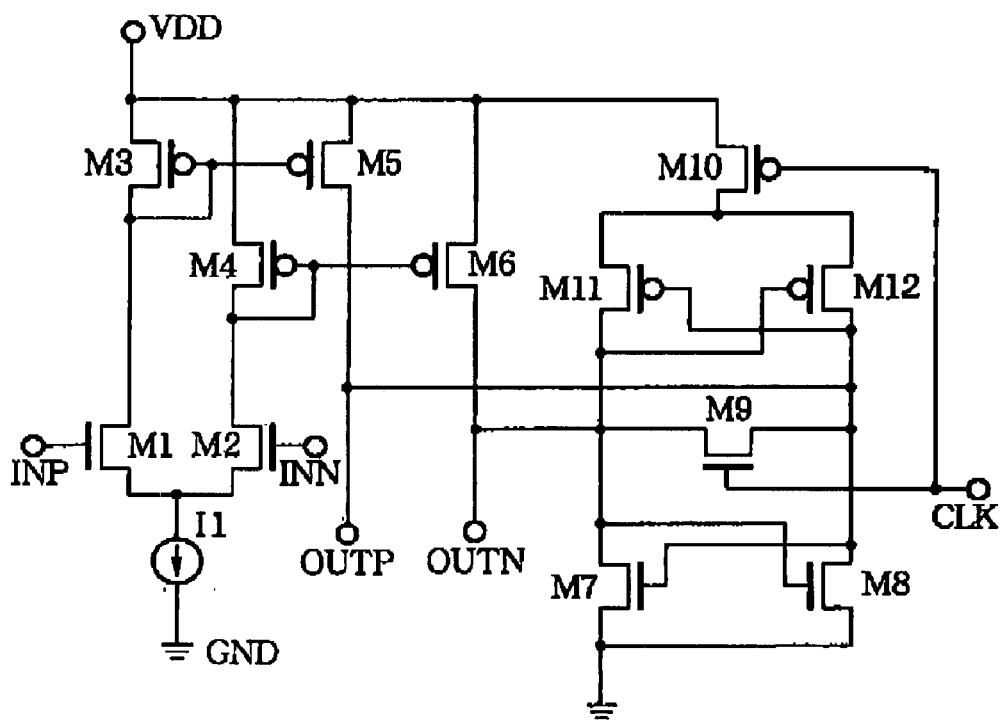
FIG. 1 is a circuit diagram of a conventional comparator circuit.
Figure 2:
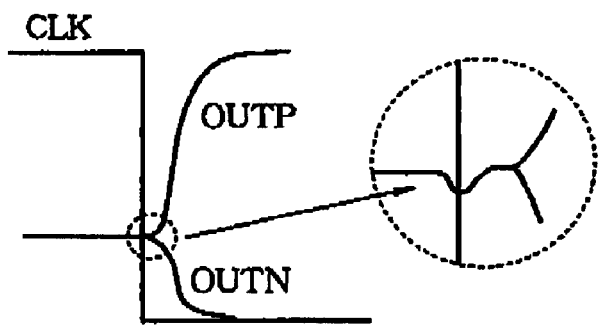
FIG. 2 is a waveform diagram illustrating divergence of the output signals of the conventional comparator circuit at the fall of the clock signal.

Embodiments of the invention will now be described with reference to the attached drawings, in which like elements are indicated by like reference characters. Each embodiment is a comparator comprising a differential amplifier circuit, a latch circuit, and a control signal generating circuit.

First Embodiment

Figure 3:
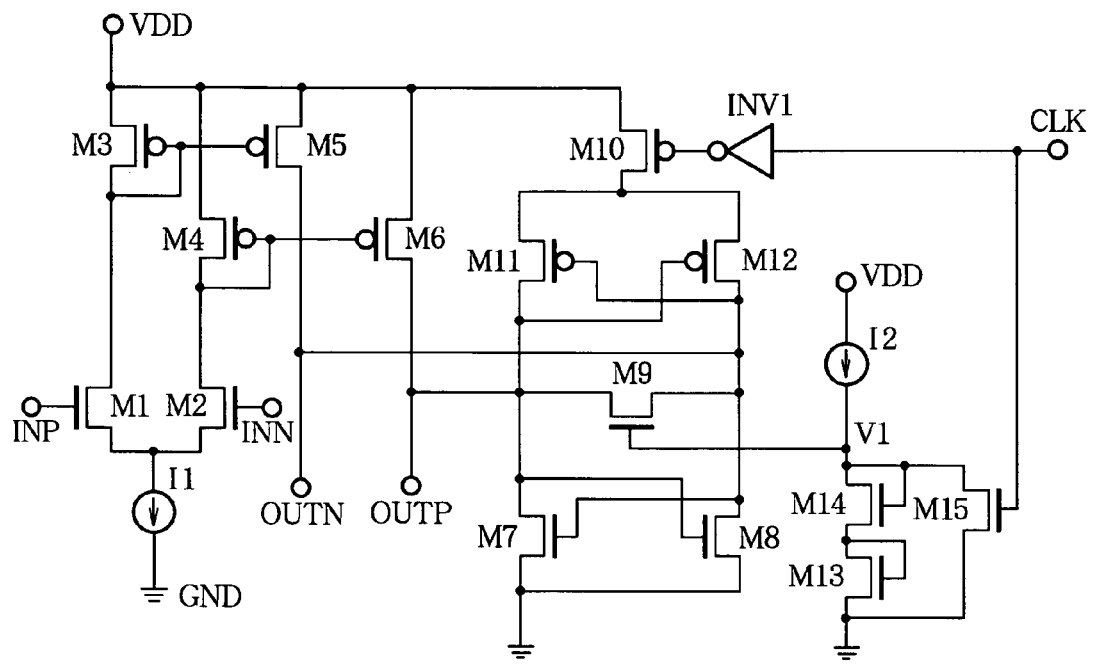
FIG. 3 is a circuit diagram of a comparator circuit according to a first embodiment of the invention.

Referring to FIG. 3, the differential amplifier circuit in the first embodiment includes NMOS transistors M1, M2 and PMOS transistors M3, M4, M5, M6, the PMOS transistors forming a current mirror load circuit. NMOS transistors M1, M2 constitute a differential transistor pair. The sources of transistors M1, M2 are connected to a current source I1, and their gates receive input signals INP, INN. The drains of transistors M1, M2 are connected to the drains and gates of transistors M3, M4 and to the gates of transistors M5, M6. The sources of transistors M3, M4, M5, M6 receive the power supply voltage VDD; the drains of transistors M5, M6 are connected to the latch circuit and to the output terminals OUTP, OUTN of the comparator.

The latch circuit comprises NMOS transistors M7, M8, M9, PMOS transistors M10, M11, M12, and an inverter INV1. NMOS transistor M7 and PMOS transistor M11 constitute an inverting amplifier with its input connected to output terminal OUTN and its output connected to output terminal OUTP. NMOS transistor M8 and PMOS transistor M12 constitute another inverting amplifier with its input connected to output terminal OUTP and its output connected to output terminal OUTN. The two inverting amplifier are accordingly cross-coupled. NMOS transistor M9 is inserted between the output terminals OUTP and OUTN as an equalizing transistor. The control terminal (gate) of transistor M9 receives a control signal from the control signal generating circuit. PMOS transistor M10 is inserted between the sources of PMOS transistors M11, M12 and the power supply as a control transistor. The inverter INV1 receives a clock signal (CLK) and outputs an inverted clock signal to the gate of transistor M10.

The sources of transistors M7, M8 are connected to ground; the gate of transistor M7 is connected to the drain of transistor M8 and output terminal OUTP. The gate of transistor M8 is connected to the drain of transistor M7 and output terminal OUTN. The gates of transistors M11, M12 are connected to output terminals OUTP, OUTN, and their drains are connected to output terminals OUTN, OUTP, respectively.

The control signal generating circuit comprises a constant current source I2 and NMOS transistors M13, M14, M15. The constant current source I2 receives the power supply voltage and outputs a constant current to a node V1. The source of transistor M13 is connected to ground, and its gate and drain are connected to the source of transistor M14. The gate and drain of transistor M14 are connected to the drain of transistor M15, and to the constant current source I2 via node V1. The gate of transistor M15 receives the clock signal CLK, its drain is connected to node V1, and its source is connected to ground. Node V1 is connected to the gate of transistor M9 in the latch circuit.

Next, the operation of the circuits in FIG. 3 will be described.

First, when the clock signal CLK is low, the gate of PMOS transistor M10 receives a high-level signal via inverter INV1, and transistor M10 switches off.

At the same time, transistor M15 switches off, so that node V1 is not directly grounded. The potential at node V1 is the product of the value of the current output from the constant current source I2 and the sum of the resistance values of transistors M13 and M14. This potential is lower than the power supply voltage VDD, but is adequate to turn on transistor M9.

The gate electrodes of transistors M1 and M2 receive the input signals INP, INN. Any potential difference between the input signals INP, INN is slightly amplified by transistors M1-M4, but as the equalizing transistor M9 is switched on, the amplified potential difference does not appear at the output terminals OUTP, OUTN.

Next, when the clock signal CLK goes high, transistor M15 switches on, grounding node V1. Transistor M9 now receives the ground potential via node V1 and switches off. Even though node V1 is grounded at this point, there is no short circuit between the power supply VDD and ground, because of the intervening constant current source I2, which limits the current flow. When transistor M9 switches off, the slightly amplified potential difference generated by transistors M1-M4 is also amplified by transistors M5-M8, and the potentials at the output terminals OUTP, OUTN begin to diverge.

PMOS transistor M10 receives a low-level clock signal through inverter INV1 and switches on, activating the latch circuit. In this state, the cross-coupled inverting amplifiers formed by transistors M7, M8, M11, M12 pull the output potentials at terminals OUTP and OUTN apart to the power supply level and the ground level. The latch circuit then holds the output terminals OUTP, OUTN at these potential levels.

As described above, in the comparator circuit according to the first embodiment, the high-level potential input to the gate of equalizing transistor M9 is lower than the high-level potential of the clock signal CLK. As the low-level potential input to equalizing transistor M9 is at the ground potential level, the gate of transistor M9 receives a signal with a voltage swing smaller than that of the clock signal CLK. Therefore the switching noise capacitively coupled from the gate to the source and drain of transistor M9 is reduced, reducing the switching noise at the output terminals OUTP, OUTN. When the latch circuit is activated, accordingly, the output levels at the output terminals OUTP, OUTN can diverge quickly to the power-supply and ground levels, and a stable digital output is obtained faster than in the conventional comparator circuit.

Second Embodiment

Figure 4:
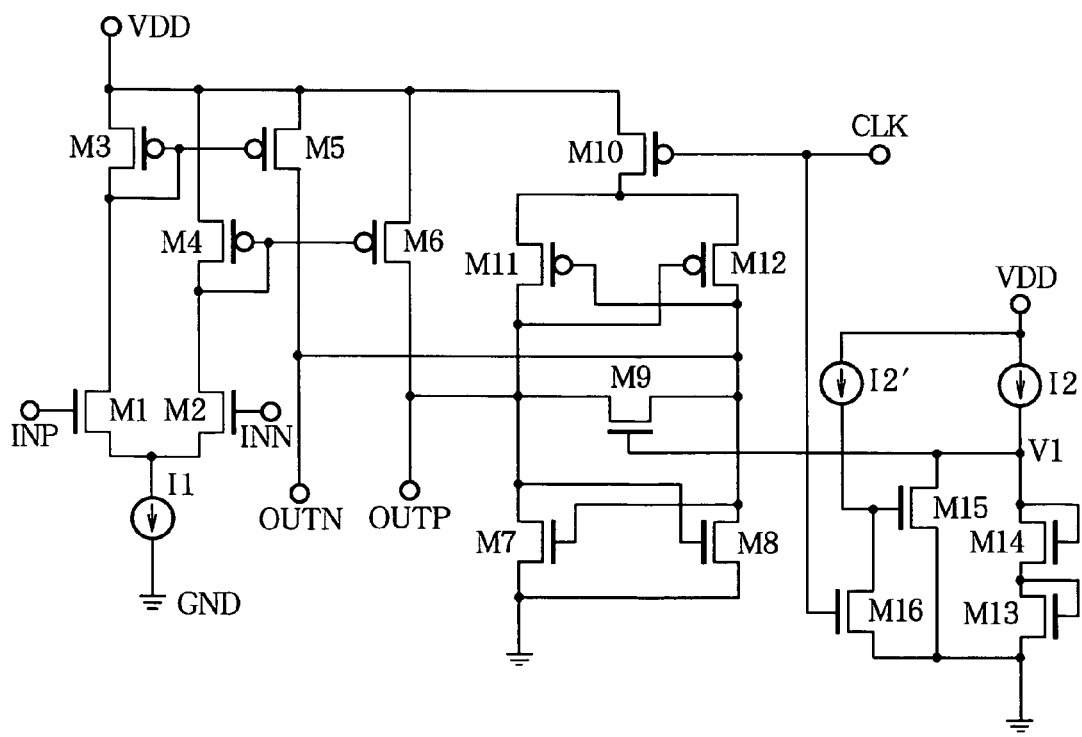
FIG. 4 is a circuit diagram of a comparator circuit according to a second embodiment of the invention.

Referring to FIG. 4, the differential amplifier circuit and the latch circuit have the same configuration in the second embodiment as in the first embodiment, except that the inverter that inverted the clock signal is omitted from the latch circuit. PMOS transistor M10 receives the clock signal (CLK) directly.

The control signal generating circuit comprises constant current sources I2, I2' and NMOS transistors M13, M14, M15, M16.

The constant current sources I2, I2' receive the power supply voltage VDD and output a pair of constant currents to a node V1 and the gate of transistor M15. The source of transistor M13 is connected to ground, and its gate and drain are connected to the source of transistor M14. The gate and drain of transistor M14 are connected to node V1. Node V1 is connected to the gate of transistor M9 in the latch circuit. The gate of transistor M15 is connected to the drain of transistor M16, its source is connected to ground, and its drain is connected to node V1 and the gate of transistor M9. The gate of transistor M16 receives the clock signal CLK and its source is connected to ground.

Next, the operation of the circuits in FIG. 4 will be described.

First, when the clock signal CLK is high, PMOS transistor M10 receives a high-level signal and switches off. At the same time, transistor M16 switches on and transistor M15 receives the ground potential and switches off, so that node V1 is not directly grounded. As in the first embodiment, the potential at node V1 is the product of the value of current output from constant current source I2 and the sum of the resistance values of transistors M13 and M14, this potential being lower than the power supply voltage VDD but adequate to turn on transistor M9.

Other operations when the clock signal CLK is high are the same as the operations when the clock signal CLK is low in the first embodiment.

Next, when the clock signal CLK goes low, transistor M16 switches off, allowing the output from constant current source I2' to charge the gate of transistor M15. Transistor M15 therefore switches on, grounding node V1. Transistor M9 now receives the ground potential via node V1 and switches off. As in the first embodiment, even though node V1 is grounded, there is no short circuit between the power supply VDD and ground, because they are interconnected through constant current source I2, which limits the current flow.

Other operations when the clock signal CLK is low are the same as the operations when the clock signal CLK is high in the first embodiment.

The comparator in the second embodiment operates when the clock signal is low instead of when the clock signal is high, but otherwise produces the same effects as in the first embodiment.

The invention is not limited to the preceding embodiments. Those skilled in the art will recognize that numerous variations are possible within the scope of the invention, which is defined in the appended claims.

What is claimed is:

1. A comparator circuit, comprising:
   a differential amplifier including a current mirror load circuit and a differential transistor pair, for receiving a pair of input signals and generating a pair of output signals responsive to the pair of input signals;
   a latch circuit including a pair of cross-coupled inverting amplifiers, for receiving and amplifying the pair of output signals from the differential amplifier;
   an equalizing transistor having a control electrode, for equalizing the pair of output signals from the differential amplifier;
   a control signal generating circuit that receives a clock signal, generates a control signal, and inputs the control signal to the control electrode of the equalizing transistor; and
   a control transistor that receives the clock signal and activates the latch circuit; wherein
   the clock signal has a first high-level potential and the control signal has a second high-level potential lower than the first high-level potential; and
   the control signal generating circuit includes
   a first constant current source generating a first constant current,
   a resistive circuit generating the control signal by conducting the first constant current, thereby generating a voltage drop, the resistive circuit including
   a second constant current source generating a second constant current;
   a first transistor having a source connected to ground, and a mutually interconnected gate and drain;
   a second transistor having a source connected to the gate and drain of the first transistor, and having a mutually interconnected gate and drain receiving the first constant current from the first constant current source;
   a third transistor having a source connected to ground, a gate receiving the second constant current from the second constant current source, and a drain connected to the drain of the second transistor and to the control electrode of the equalizing transistor; and
   a fourth transistor having a source connected to ground, a drain connected to the gate of the third transistor, and a gate receiving the clock signal.

2. The comparator circuit of claim 1, wherein the latch circuit comprises a first inverting amplifier receiving one output signal in the pair of output signals output by the differential amplifier and a second inverting amplifier receiving another output signal in the pair of output signals output by the differential amplifier, the first inverting amplifier generating an inverted output signal that is also received by the second inverting amplifier, the second inverting amplifier generating an inverted output signal that is also received by the first inverting amplifier.

* * * * *